United States Patent
Wang et al.

(10) Patent No.: US 10,135,464 B2
(45) Date of Patent: Nov. 20, 2018

(54) RELIABILITY-ASSISTED BIT-FLIPPING DECODING ALGORITHM

(71) Applicant: SK hynix Inc., Gyeonggi-do OT (KR)

(72) Inventors: Chung-Li Wang, Fremont, CA (US); Lingqi Zeng, San Jose, CA (US); Yi-Min Lin, San Jose, CA (US)

(73) Assignee: SK Hynix Inc., Gyeonggi-do (KR)

( * ) Notice: Subject to any disclaimer, the term of this patent is extended or adjusted under 35 U.S.C. 154(b) by 251 days.

(21) Appl. No.: 14/988,303

(22) Filed: Jan. 5, 2016

(65) Prior Publication Data

US 2016/0197624 A1   Jul. 7, 2016

Related U.S. Application Data

(60) Provisional application No. 62/099,921, filed on Jan. 5, 2015.

(51) Int. Cl.
| | |
|---|---|
| *H03M 13/11* | (2006.01) |
| *H03M 13/15* | (2006.01) |
| *H03M 13/23* | (2006.01) |
| *H03M 13/29* | (2006.01) |

(52) U.S. Cl.
CPC ...... *H03M 13/1108* (2013.01); *H03M 13/152* (2013.01); *H03M 13/1515* (2013.01); *H03M 13/23* (2013.01); *H03M 13/2957* (2013.01); *H03M 13/2963* (2013.01)

(58) Field of Classification Search
CPC ......... H03M 13/1108; H03M 13/1515; H03M 13/152; H03M 13/23; H03M 13/2957; H03M 13/2963; H03M 13/3753; H03M 13/255; H03M 13/37; H03M 13/1105; G11C 29/42; G11B 2020/185
See application file for complete search history.

(56) References Cited

U.S. PATENT DOCUMENTS

| | | | | |
|---|---|---|---|---|
| 7,254,060 | B2 * | 8/2007 | Kawai | G11C 16/20 365/185.09 |
| 8,929,009 | B2 * | 1/2015 | Yang | H03M 13/1111 360/39 |
| 9,787,329 | B2 * | 10/2017 | Ish-Shalom | H03M 13/098 |
| 2003/0106014 | A1 * | 6/2003 | Dohmen | H03M 13/1535 714/785 |
| 2014/0164865 | A1 | 6/2014 | Sharon et al. | |
| 2014/0298131 | A1 | 10/2014 | Chen et al. | |
| 2015/0188570 | A1 | 7/2015 | Kwok et al. | |

OTHER PUBLICATIONS

Sipser et al., Expander Codes, Nov. 1996, p. 1710-1722, vol. 42, No. 6, IEEE.
Nguyen et al., Two-Bit Bit Flipping Algorithms for LDPC Codes and Collective Error Correction, Apr. 2014, p. 1153-1163, vol. 62, No. 4, IEEE.

* cited by examiner

*Primary Examiner* — Phung M Chung
(74) *Attorney, Agent, or Firm* — IP & T Group LLP

(57) ABSTRACT

A method for decoding low-density parity check (LDPC) codes, includes computing an initial syndrome of an initial output, obtaining an initial number of unsatisfied checks based on the computed initial syndrome, and when the initial number of unsatisfied checks is greater than zero, computing a reliability value with a parity check, performing a bit flip operation, computing a subsequent syndrome of a subsequent output, and ending decoding when a number of unsatisfied checks obtained based on the computed subsequent syndrome is equal to zero.

14 Claims, 5 Drawing Sheets

RELIABILITY-ASSISTED BIT-FLIPPING DECODING ALGORITHM

CROSS-REFERENCE TO RELATED APPLICATIONS

This application claims the benefit of U.S. Provisional Application No. 62/099,921 filed Jan. 5, 2015 entitled "RELIABILITY-ASSISTED BIT-FLIPPING DECODING ALGORITHM (RABF)", the entire contents of which are incorporated herein by reference.

BACKGROUND

1. Field

Exemplary embodiments of the present disclosure relate to a signal processing and coding technique.

2. Description of the Related Art

Magnetic storage technology was most commonly used for storing data, but the lower weight and faster read/write operations requirements for current electronic devices make the magnetic storage technology less desirable. The NAND-based technology is able to fulfill the demand for high density data storage devices but this technology is costly. There exists a need to lower the cost of NAND-based technology while maintaining performance levels.

SUMMARY

Aspects of the invention include a method for decoding low-density parity check (LDPC) codes. The method includes computing an initial syndrome of an initial output, obtaining an initial number of unsatisfied checks based on the computed initial syndrome, and when the initial number of unsatisfied checks is greater than zero, computing a reliability value with a parity check, performing a bit flip operation, computing a subsequent syndrome of a subsequent output, and ending decoding when a number of unsatisfied checks obtained based on the computed subsequent syndrome is equal to zero.

DETAILED DESCRIPTION

Figure 1:
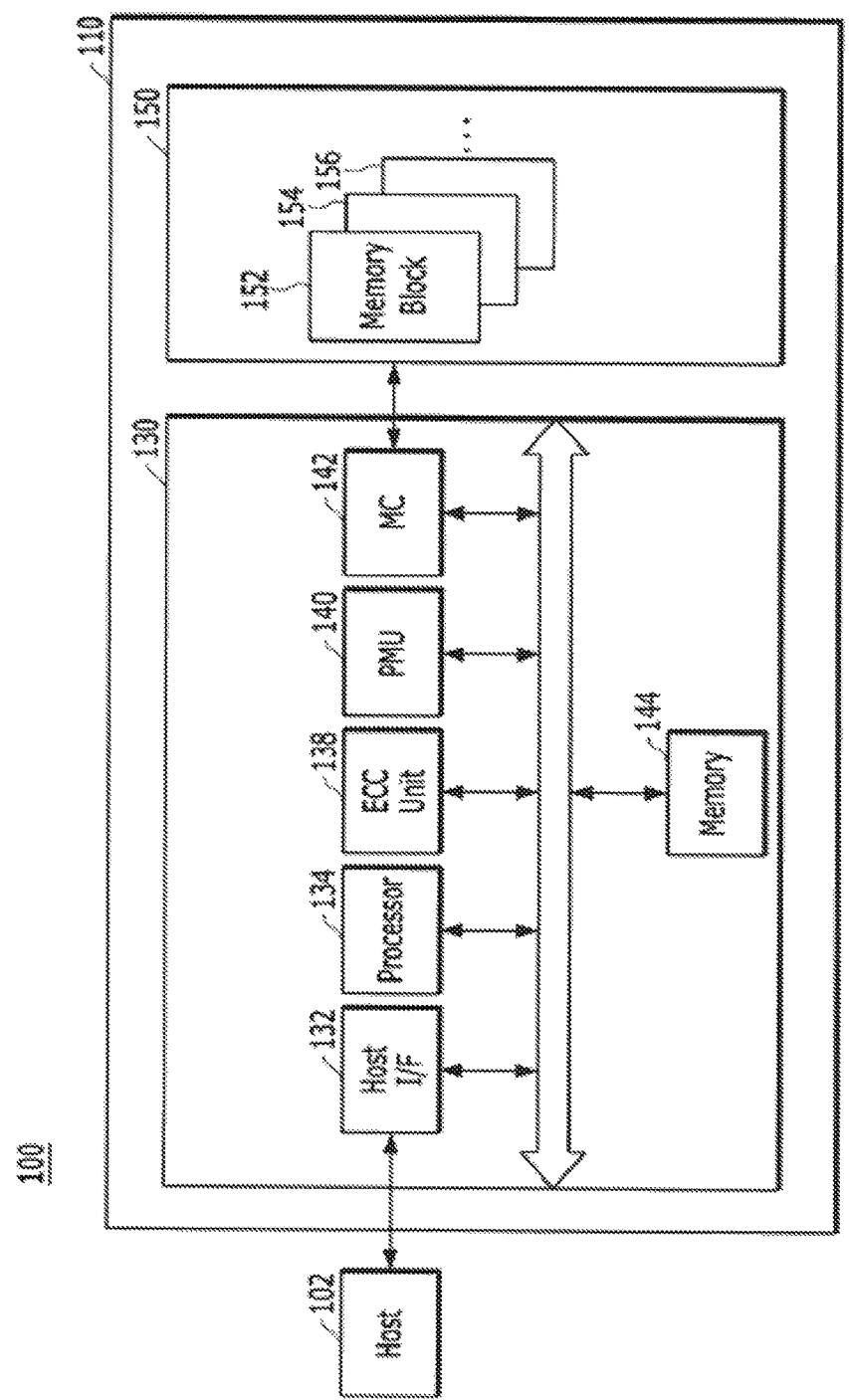
FIG. 1 is a diagram of a memory system.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

In some embodiments, the present invention will be applied to a data processing system shown in FIG. 1.

FIG. 1 illustrates a data processing system 100 including a memory system in which embodiments of the present invention are applied. The data processing system 100 shown in FIG. 1 is for illustration only. Other constructions of the data processing system 100 could be used without departing from the scope of this disclosure. Although FIG. 1 illustrates one example of the data processing system 100, various changes may be made to FIG. 1. For example, the data processing system 100 may include any of elements, or may not include any of elements in any suitable arrangement.

Referring to FIG. 1, the data processing system 100 may include a host 102 and a memory system 110.

The host 102 may include, for example, a portable electronic device such as a mobile phone, an MP3 player and a laptop computer or an electronic device such as a desktop computer, a game player, a TV and a projector.

The memory system 110 may operate in response to a request from the host 102, and in particular, store data to be accessed by the host 102. In other words, the memory system 110 may be used as a main memory system or an auxiliary memory system of the host 102. The memory system 110 may be implemented with any one of various kinds of storage devices, according to the protocol of a host interface to be electrically coupled with the host 102. The memory system 110 may be implemented with any one of various kinds of storage devices such as a solid state drive (SSD), a multimedia card (MMC), an embedded MMC (eMMC), a reduced size MMC (RS-MMC) and a micro-MMC, a secure digital (SD) card, a mini-SD and a micro-SD, a universal serial bus (USB) storage device, a universal flash storage (UFS) device, a compact flash (CF) card, a smart media (SM) card, a memory stick, and so forth.

The storage devices for the memory system 110 may be implemented with a volatile memory device such as a dynamic random access memory (DRAM) and a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM) and a resistive RAM (RRAM).

The memory system 110 may include a memory device 150 which stores data to be accessed by the host 102, and a controller 130 which controls storage of data in the memory device 150.

The controller 130 and the memory device 150 may be integrated into one semiconductor device. For instance, the controller 130 and the memory device 150 may be integrated into one semiconductor device and configure a solid state drive (SSD). When the memory system 110 is used as the SSD, the operation speed of the host 102 that is electrically coupled with the memory system 110 may be significantly increased.

The controller 130 and the memory device 150 may be integrated into one semiconductor device and configure a memory card. The controller 130 and the memory device 150 may be integrated into one semiconductor device and configure a memory card such as a Personal Computer Memory Card International Association (PCMCIA) card, a compact flash (CF) card, a smart media (SM) card (SMC), a memory stick, a multimedia card (MMC), an RS-MMC and a micro-MMC, a secure digital (SD) card, a mini-SD, a micro-SD and an SDHC, and a universal flash storage (UFS) device.

For another instance, the memory system 110 may configure a computer, an ultra mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation device, a black box, a digital camera, a digital multimedia broadcasting (DMB) player, a three-dimensional (3D) television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, an RFID device, or one of various component elements configuring a computing system.

The memory device 150 of the memory system 110 may retain stored data when power supply is interrupted and, in particular, store the data provided from the host 102 during a write operation, and provide stored data to the host 102 during a read operation. The memory device 150 may include a plurality of memory blocks 152, 154 and 156. Each of the memory blocks 152, 154 and 156 may include a plurality of pages. Each of the pages may include a plurality of memory cells to which a plurality of word lines (WL) are electrically coupled. The memory device 150 may be a non-volatile memory device, for example, a flash memory. The flash memory may have a three-dimensional (3D) stack structure.

The controller 130 of the memory system 110 may control the memory device 150 in response to a request from the host 102. The controller 130 may provide the data read from the memory device 150, to the host 102, and store the data provided from the host 102 into the memory device 150. To this end, the controller 130 may control overall operations of the memory device 150, such as read, write, program and erase operations.

In detail, the controller 130 may include a host interface unit 132, a processor 134, an error correction code (ECC) unit 138, a power management unit (PMU) 140, a memory controller (MC) 142, and a memory 144.

The host interface unit 132 may process commands and data provided from the host 102, and may communicate with the host 102 through at least one of various interface protocols such as universal serial bus (USB), multimedia card (MMC), peripheral component interconnect-express (PCI-E), serial attached SCSI (SAS), serial advanced technology attachment (SATA), parallel advanced technology attachment (PATA), small computer system interface (SCSI), enhanced small disk interface (ESDI), and integrated drive electronics (IDE).

The ECC unit 138 may detect and correct errors in the data read from the memory device 150 during the read operation. The ECC unit 138 may not correct error bits when the number of the error bits is greater than or equal to a threshold number of correctable error bits, and may output an error correction fail signal indicating failure in correcting the error bits.

The ECC unit 138 may perform an error correction operation based on a coded modulation such as a low density parity check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), a Block coded modulation (BCM), and so on. The ECC unit 138 may include all circuits, systems or devices for the error correction operation.

The PMU 140 may provide and manage power for the controller 130, that is, power for the component elements included in the controller 130.

The MC 142 may serve as a memory interface between the controller 130 and the memory device 150 to allow the controller 130 to control the memory device 150 in response to a request from the host 102. The MC 142 may generate control signals for the memory device 150 and process data under the control of the processor 134. When the memory device 150 is a flash memory such as a NAND flash memory, the MC 142 may generate control signals for the NAND flash memory 150 and process data under the control of the processor 134.

The memory 144 may serve as a working memory of the memory system 110 and the controller 130, and store data for driving the memory system 110 and the controller 130. The controller 130 may control the memory device 150 in response to a request from the host 102. For example, the controller 130 may provide the data read from the memory device 150 to the host 102 and store the data provided from the host 102 in the memory device 150. When the controller 130 controls the operations of the memory device 150, the memory 144 may store data used by the controller 130 and the memory device 150 for such operations as read, write, program and erase operations.

The memory 144 may be implemented with volatile memory. The memory 144 may be implemented with a static random access memory (SRAM) or a dynamic random access memory (DRAM). As described above, the memory 144 may store data used by the host 102 and the memory device 150 for the read and write operations. To store the data, the memory 144 may include a program memory, a data memory, a write buffer, a read buffer, a map buffer, and so forth.

The processor 134 may control general operations of the memory system 110, and a write operation or a read operation for the memory device 150, in response to a write request or a read request from the host 102. The processor 134 may drive firmware, which is referred to as a flash translation layer (FTL), to control the general operations of the memory system 110. The processor 134 may be implemented with a microprocessor or a central processing unit (CPU).

A management unit (not shown) may be included in the processor 134, and may perform bad block management of the memory device 150. The management unit may find bad memory blocks included in the memory device 150, which are in unsatisfactory condition for further use, and perform bad block management on the bad memory blocks. When the memory device 150 is a flash memory, for example, a NAND flash memory, a program failure may occur during the write operation, for example, during the program operation, due to characteristics of a NAND logic function. During the bad block management, the data of the program-failed memory block or the bad memory block may be programmed into a new memory block. Also, the bad blocks due to the program fail seriously deteriorates the utilization efficiency of the memory device 150 having a 3D stack structure and the reliability of the memory system 110, and thus reliable bad block management is required.

Figure 2:
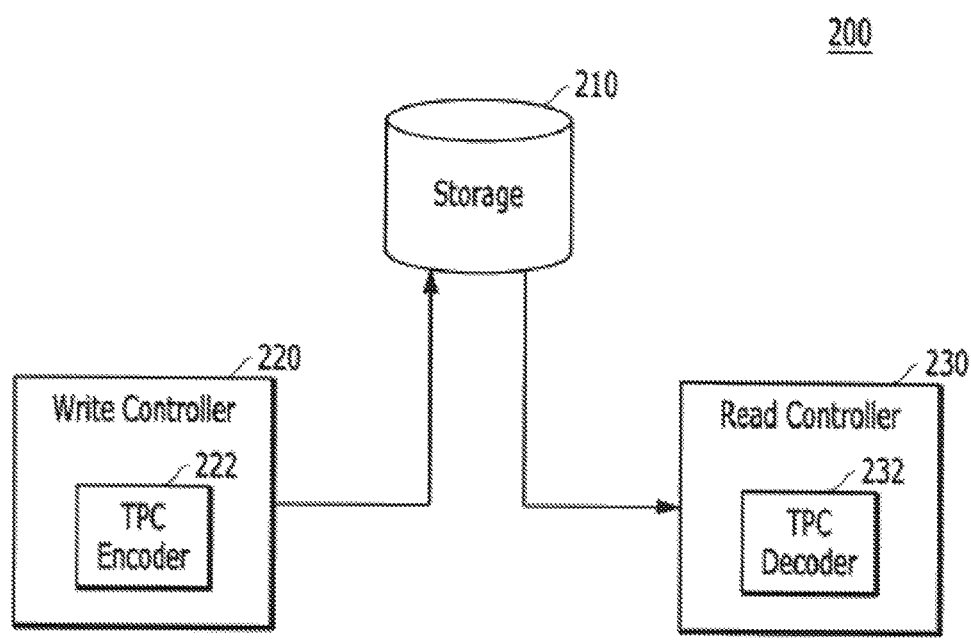
FIG. 2 is a diagram of components of a memory system.

FIG. 2 is a block diagram of a memory system 200 including an encoder and a decoder in accordance with embodiments of the present invention. For example, the memory system 200 corresponds to the memory system 110 shown in FIG. 1. For clarity, components of FIG. 1 which are directly related to embodiments of the present invention are not shown herein.

Referring to FIG. 2, the memory system 200 includes a storage 210, a write controller 220 and a read controller 230. For example, the storage 210 corresponds to the memory device 150 shown in FIG. 1, and the write controller 220 and the read controller 230 correspond to the ECC unit 138 shown in FIG. 1.

The storage 210 may include solid state storage such as NAND flash. The write controller 220 receives data from host 102 in FIG. 1, and processes the data on the storage 210. The read controller 230 reads the data on the storage 210, and processes the data. The write controller 220 includes a TPC encoder 222 and the read controller 230 include a TPC decoder 232 as the components for the TPC scheme, respectively.

LDPC (low density parity check) codes can be decoded by soft-message (multi-bit) or hard-message (single-bit) decoding algorithms. Among the latter ones, the modified parallel bit-flipping (MPBF) algorithm has been shown to save decoding power and hardware. However, its error correction performance is quite limited by the flipping rule relying on one-bit messages, which are provided by the parity checks. When the channel output is too noisy, traditional soft-message decoding algorithms are still relied upon, such as Min-Sum, to obtain the full error-correction capability.

Thus, disclosed herein is multi-bit message as reliability information for each bit and a soft-message decoding algorithm based on MPBF. With a more sophisticated flipping rule, which utilizes multi-bit messages provided by the parity checks, the error correction can be enhanced significantly.

Previous MPBF processes will described below for descriptive purposes. In a previous MPBF process, assume that $x=[x_0, x_1, x_2, \ldots, x_{N-1}]$ is a bit vector, and $H=[h_{i,j}]$ is a sparse matrix. Each row of H is a parity check, which checks some bits of x and will be satisfied if x is a codeword of H. Suppose that x is sent through the binary-symmetric channel (BSC), and the output is y. The syndrome of y is defined by $s=yH^T$. An entry of s corresponds to a parity check of H. The binary weight of s, denoted by $\|s\|$, is the number of unsatisfied checks. The number of connected unsatisfied checks for column j is denoted as $\|s\|_j$, where $h_j$ is the j-th column of H.

The modified parallel bit-flipping algorithm is an iterative algorithm, which tries to correct errors by flipping several bits in each iteration. To find the collection of flipped bits, MPBF uses syndrome weight and the number of connected unsatisfied checks for each column.

The iteration procedure is described below:

1.) For t=0, initialize $y^{(0)}=y$ and compute tentative syndrome $s^{(0)}=y^{(0)}H^T$. Obtain $\|s^{(0)}\|$. If the maximal column degree of H is $\gamma$max, $u^{(1)}=\gamma$max. Set $t \leftarrow t+1$.

2.) In any t-th iteration for t>0, obtain $\|s^{(t-1)}\|_j$ and flip bit $y_j^{(t)}=1 \oplus y_j^{(t-1)}$ if $\|s^{(t-1)}\|_j \geq u^{(t)}$ or $\|s^{(t-1)}\|_j = \gamma_j$ for each column J. $\gamma_j$ is the degree of the i-th column. Otherwise $y_j^{(t)}=y_j^{(t-1)}$.

3.) Compute syndrome $s^{(t)}=y^{(t)}H^T$. If $\|s^{(t)}\|$ is all zero, stop the decoding. Otherwise, set $t \leftarrow t+1$.

4.) In any t-th iteration for t>0, $u^{(t)}$ (flipping threshold) is determined by a special function of t, $\|s^{(t-1)}\|$, $u^{(t-1)}$, and flip_flag. flip_flag is the flag to show if there is any bit flipped, that is, $y_j^{(t)}=1+y_j^{(t-1)}$. Then go back to the second step.

The special function of $u^{(t)}$ has 3 Input signals t, $\|s^{(t-1)}\|$, $u^{(t-1)}$, and flip_flag with 3 parameters iter_th, u_fix1, u_fix2, and P-th. The parameters should be optimized, and the function is defined as below:

1.) If t>=iter_th and (flip_flag=1 or (flip_flag=0 and u_fix1<$u^{(t-1)}$, $u^{(t)}$=u_fix1.

2.) Else if flip_flag=0, $u^{(t)}=u^{(t-1)}-1$.

3.) Else if flip_flag=1 and $\|s^{(t-1)}\|$<=P_th, $u^{(t)}$=u_fix2.

4.) Else if flip_flag=1 and $\|s^{(t-1)}\|$>P_th,
If $u^{(t-1)}=\gamma$max, u(t)=$\gamma$max−1
If $u^{(t-1)}=\gamma$max−1, $u^{(t)}=\gamma$max
If $u^{(t-1)}<\gamma$max−1, $u^{(t)}=\gamma$max−1.

Figure 3:
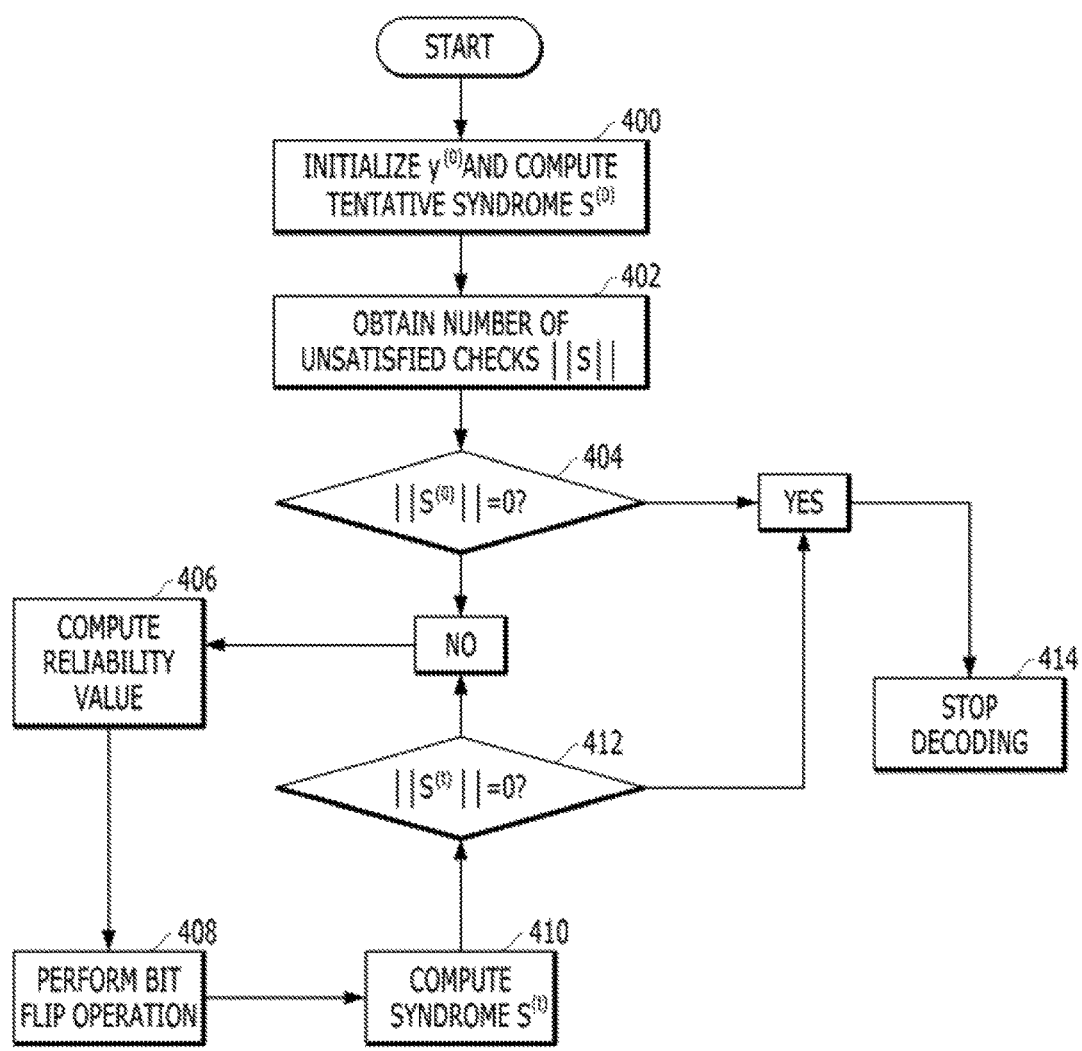
FIG. 3 is a flowchart of steps for decoding according to aspects of the invention.

Referring next to FIG. 3, the disclosed systems and methods utilizing reliability-assisted bit-flipping decoding algorithms will be described. Embodiments of the invention introduce a channel reliability value and a decoder decision reliability value.

The channel reliability $l=[l_0, l_1, l_2, \ldots, l_{N-1}]$ and decoder decision reliability $r=[r_0, r_1, r_2, \ldots, r_{N-1}]$, are all positive real-value vectors. Each number $l_j$ represent the channel reliability of $y_j$. Each number $r_j$ represents the decoder decision reliability of $y_j$. The larger reliability means the more reliable hard decision. In the t-th iteration of RABF, the j-th bit sends the hard decision $y_j^{(t-1)}$ with a reliability value $r_j^{(t-1)}$ as the message to its connected parity checks. The i-th parity check computes not only the syndrome $s_i^{(t-1)}$ but also a reliability value $c_{i,j}^{(t-1)}$ as the message to each of its connected bits. The check node message $c_{i,j}^{(t-1)}$ shows the certainty of $s_i^{(t-1)}$ with respect to the j-th bit and is obtained from the reliability values from all connected bits. Then based on $c_{i,j}^{(t-1)}$ sent from the connected parity checks, the decoder will make the hard decision $y_j^{(t)}$ and modify its reliability $r_j^{(t)}$.

Assume that $\gamma_j$ is the degree of the i-th column, the maximal column degree of H is $\gamma$max, the maximal reliability is rmax, and the minimal reliability is rmin. The iteration procedure is described below:

At step 400, $y_{(0)}$ is initialized and the tentative syndrome $s^{(0)}$ is computed. For t=0, initialize $y^{(0)}=y$ and compute tentative syndrome $s^{(0)}=y^{(0)}H^T$.

At step 402, a number of unsatisfied checks is obtained. The number of unsatisfied checks is denoted as $\|s\|$, with the initial number of unsatisfied checks being denoted as $\|s^{(0)}\|$ herein.

At step 404, if the number of unsatisfied checks is 0, the process proceeds to step 414 and the decoding is stopped. If the number of unsatisfied checks is not equal to zero, then the process proceeds to step 406.

At step 406, the reliability value is computed. The reliability value may be computed as $c_{i,j}^{(0)} = \min \Sigma_{j' \in \{\forall j' | h_{i,j'}=1, j' \neq j\}} r_{j'}^{(0)}$. Set $u^{(1)} = \text{rmax}(\gamma \max - 2)$. Set $t \leftarrow t+1$.

At step 408, a bit flip operation is performed. The bit flip operation may be performed as followed:

In any t-th iteration for t>0, obtain $m_j^{(t)} = (2(y_j^{(0)} \oplus y_j^{(t-1)}) - 1)l_j + \Sigma_{i \in \{\forall i | h_{i,j}=1\}}(2s_i^{(t-1)}-1)c_{i,j}^{(t-1)}$. Then for each column j:
  1) Flip bit $y_j^{(t)} = 1 \oplus y_j^{(t-1)}$ and $r_j^{(t)} = \text{rmin}$ if $m_j^{(t)} \geq u^{(t)}$ or $m_j^{(t)} = \text{rmax}(\gamma_j + 1)$.
  2) Update $r_j^{(t)} = r_j^{(t-1)} + 1$ if $m_j^{(t)} \leq v^{(t)}$.
  3) Update $r_j^{(t)} = r_j^{(t)} - 1$ if $m_j^{(t)} \leq \max(u)^{(t)} - 3, -1)$ or $m_j^{(t)} = \text{rmin}(\gamma^j + 1)$.
  4) Otherwise $y_j^{(t)} = y_j^{(t-1)}$ and $r_j^{(t)} = r_j^{(t-1)}$.

At step 410, the syndrome for the next iterative time step is computed as $s^{(t)} = y^{(t)} H^T$.

At step 412, the number of unsatisfied checks of the next iterative syndrome is obtained. If $\|s^{(t)}\|$ is all zero, then the process proceeds to step 414 and decoding is stopped. If $\|s^{(t)}\|$ is not all zero, steps 406, 408 and 410 are repeated. Thus, compute $c_{i,j}^{(t)} = \min_{j' \in \{h_{i,j'}=1, j' \neq j\}} r_{j'}^{(t)}$ and set $t \leftarrow t+1$.

In any t-th iteration for t>1, $u^{(t)}$ and $v^{(t)}$ are determined by a special function of $\|s^{(t-1)}\|$, $u^{(t-1)}$, and flip_num. flip_num is the number of bits which have been flipped in step 408 (2). Then go back to the step 408.

$u^{(t)}$ represents the flipping threshold and $v^{(t)}$ represents the confirming threshold. The flipping indicator is compared with the flipping threshold to determine if the decoder decision has to be flipped or not. If the comparisons show high probability to have correct decoder decision by flipping, the result is to flip the decision and set the decoder decision reliability to low magnitude. The threshold is controlled by the number of unsatisfied checks, flipped bits, etc, to keep the stability of flipping process.

The flipping indicator is also compared with the confirming threshold if no flipping is made by comparing with the flipping threshold. If the comparisons show low probability to have correct decoder decision by flipping, the result is not only keeping the decoder decision but increase the magnitude of decoder decision reliability.

The special functions for $u^{(t)}$ and $v^{(t)}$ have 3 input signals $\|s^{(t-1)}\|$, $u^{(t-1)}$, and flip_num with 3 parameters par1, flip1, and flip2. These parameters should be optimized for any code matrix. The function of $u^{(t)}$ is defined as below.

1) If t=1, $u^{(1)} = \text{rmax}(\gamma \max - 2)$
2) If t>1 and ($\|s^{(t-1)}\| \geq \text{par1}$ and flip_num<flip1 and flip_num>0), If $u^{(t-1)} \leq -\text{rmax}$, $u^{(t)} = -2\text{rmax}$. Else $u^{(t)} = u^{(t-1)} - \text{rmax}$.
3) If t>1 and ($\|s^{(t-1)}\| \geq \text{par1}$ and flip_num=0), $u^{(t)} = u^{(t-1)} - \text{rmax}$.
4) If t>1 and ($\|s^{(t-1)}\| \geq \text{par1}$ and flip_num>=flip2), If $u^{(t-1)} \geq 2\text{rmax}$, $u^{(t)} = 3\text{rmax}$. Else $u^{(t)} = u^{(t)} + \text{rmax}$.
5) If t>1 and ($\|s^{(t-1)}\| < \text{par1}$ and flip_num=0), $u^{(t)} = u^{(t-1)} - \text{rmax}$.
6) If t>1 and ($\|s^{(t-1)}\| < \text{par1}$ and flip_num<3), $u^{(t)} = u^{(t-1)} - \text{rmin}$.
7) If t>1 and ($\|s^{(t-1)}\| < \text{par1}$ and flip_num<flip2), $u^{(t)} = -\text{rmax}$.
8) If t>1 and ($\|s^{(t-1)}\| < \text{par1}$ and flip_num>=flip2), $u^{(t)} = 0$.

The function of $v^{(t)}$ is defined as below:
1) If $\|s^{(t-1)}\| \geq \text{par1}$, $v^{(t)} = \min(u^{(t)} - \text{rmin}, -\text{rmin})$.
2) If $\|s^{(t-1)}\| < \text{par1}$, $v^{(t)} = \min(u^{(t)} - \text{rmin}, 0)$.

In addition, for each i, definitions may include

1) $\min1_i^{(t)} = \min_{j' \in \{h_{i,j'}=1\}} r_{j'}^{(t-1)}$

2) $\min2_i^{(t)} = \min_{j'' \in \{h_{i,j''}=1, j'' \neq \arg\min_{j' \in \{h_{i,j'}=1\}} r_{j'}^{(t-1)}\}} r_{j''}^{(t-1)}$ Furthermore, the reliability value $c_{i,j}^{(t)}$ can be computed efficiently as
1) if $r_j^{(t-1)} = \min1_i^{(t)}$, $c_{i,j}^{(t)} = \min2_i^{(t)}$
2) Otherwise, $c_{i,j}^{(t)} = \min1_i^{(t)}$.

Figure 4:
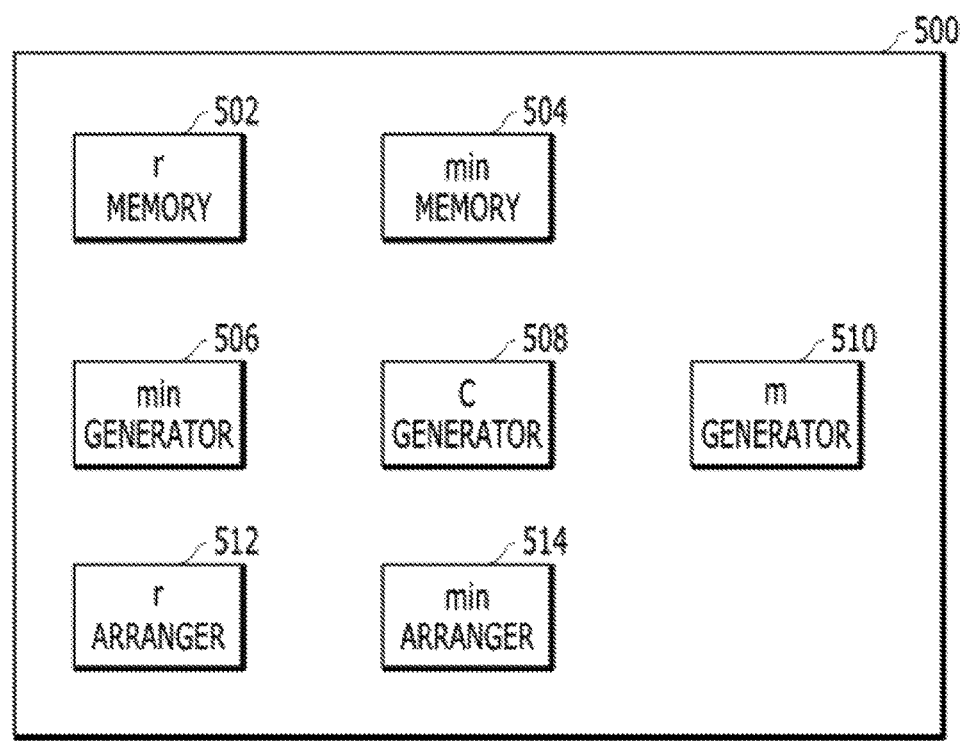
FIG. 4 is a diagram of components according to aspects of the invention.

FIG. 4 is a diagram of a system 500 for various components to effectuate the above disclosed process. The system 500 includes an r memory 502 which may be configured to store the decoder decision reliability r. The system 500 may include a min memory 504 and a min generation 506 for storing and computing the min values described above respectively. The system 500 may include circuits configured as c generator 508 and m generator 510 for computing the reliability c and m values. The system 500 may include an circuit configured as an r arranger to send and re-arrange r from bit order to check order. The system 500 may also include a circuit configured as a min arranger for sending and re-arranging min values from check order to bit order.

Figure 5:
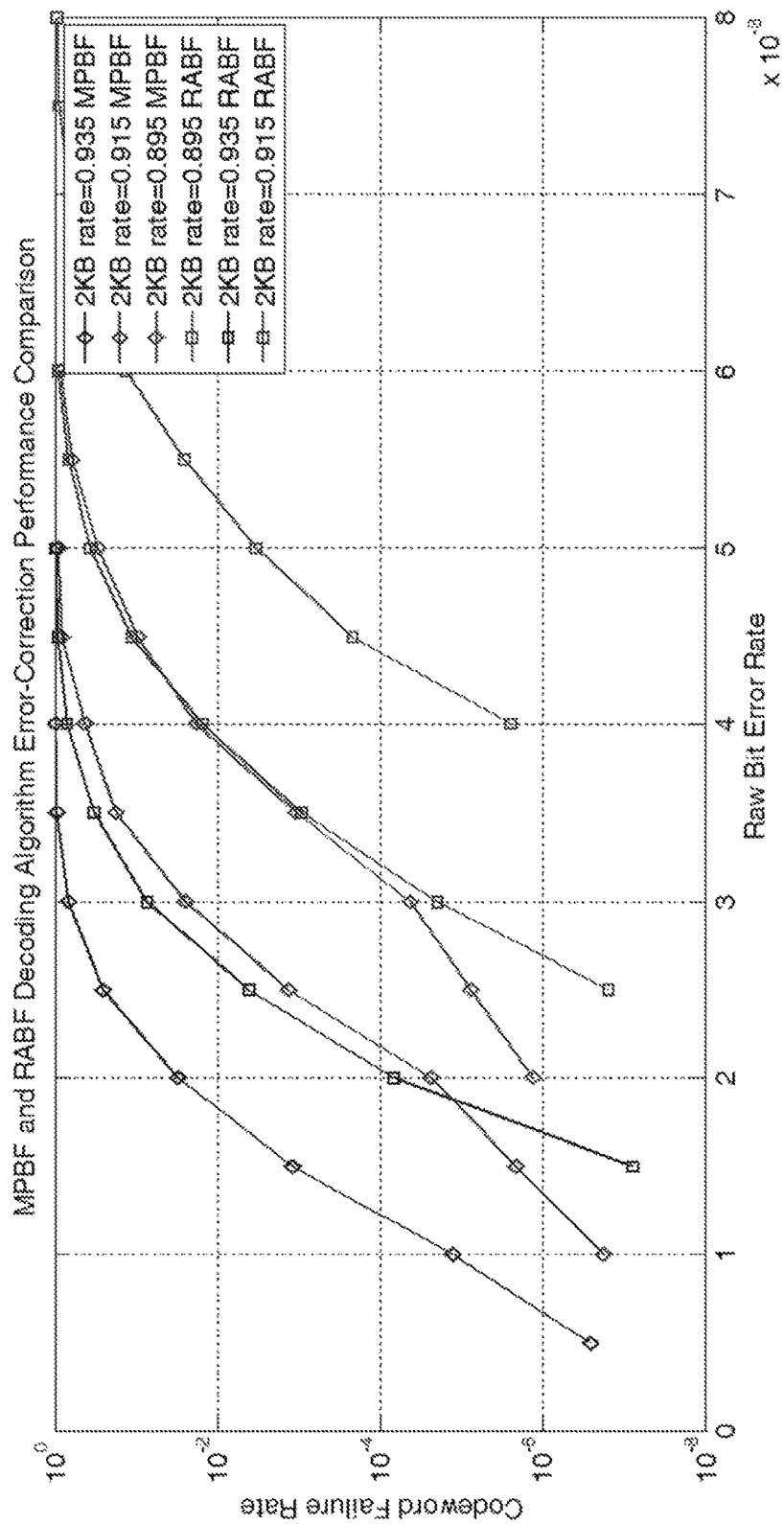
FIG. 5 is a graph of performance in accordance with aspects of the invention.

FIG. 5 is a graph 600 showing simulation results. With 2-state reliabilities (rmin=1 and rmax=2) and $l_j=2$ for all j, the RABF has much better performance than that of MPBF for hard decoding, with various code rates.

The RABF improves the error-correction performance of the bit-flipping algorithm in significance at reasonable hardware cost. By using reliability as the flipping message, the RABF decoder differentiates more reliable and less reliable bits and checks, so the later can be selected and flipped. With RABF, the LDPC decoder can reduce the usage of high-performance and high-power soft-message decoding and can correct the same number of errors with lower power.

Advantageously, the invention disclosed herein provides a scheme that flips bits and updates reliability values dynamically, uses the sum of reliability values from the channel and checks as the flipping indicator, sends reliability values from the bits to the checks (the values indicate how reliable the decoding hard decisions are), and sends reliability values from the checks to the bits (the values mean how certain the syndrome values are.

While the present invention has been particularly shown and described with reference to exemplary embodiments thereof, it will be understood by those of ordinary skill in the art that various changes in form and details may be made therein without departing from the spirit and scope of the present invention as defined by the following claims. Thus, the foregoing is by way of example only and is not intended to be limiting. For example, any numbers of elements illustrated and described herein are by way of example only. The present invention is limited only as defined in the following claims and equivalents thereof.

What is claimed is:

1. A method for decoding low-density parity check (LDPC) codes of a memory system including a memory device coupled with a controller, the method comprising:
   computing, with the controller, an initial syndrome of an initial output of a channel,
   obtaining an initial number of unsatisfied checks based on the computed initial syndrome, and
   when the initial number of unsatisfied checks is greater than zero, computing reliability values with parity checks, wherein a sum of the reliability values from the channel and the parity checks is utilized as a flipping indicator, generating a comparison result of comparing the flipping indicator with a flipping threshold, performing a bit flip operation and adjusting the reliability values in accordance with at least the comparison result, wherein the bit flip operation flips more than one bit parallelly, computing a subsequent syndrome of a subsequent output, and ending the decoding of LDPC codes, when a subsequent number of unsatisfied checks obtained based on the computed subsequent syndrome is equal to zero.

2. The method of claim 1, wherein the bit flip operation utilizes a channel reliability vector.

3. The method of claim 1, wherein the bit flip operation utilizes a decoder decision reliability vector.

4. The method of claim 1, further comprising, when the initial number of unsatisfied checks is zero, ending decoding.

5. The method of claim 1, wherein the flipping threshold is computed by the subsequent number of unsatisfied checks.

6. The method of claim 1, wherein the bit flip operation utilizes a confirming threshold.

7. The method of claim 6, wherein the confirming threshold is computed by a flipping threshold and the number of subsequent unsatisfied checks.

8. An apparatus for decoding low-density parity check codes, the apparatus comprising:
a memory device, and
a controller, coupled with the memory device, to control decoding process of low-density parity check (LDPC) codes of the memory device,
the controller configured to:
compute an initial syndrome of an initial output of a channel,
obtain an initial number of unsatisfied checks based on the computed initial syndrome,
when the initial number of unsatisfied checks is greater than zero, compute reliability values with parity checks, wherein a sum of the reliability values from the channel and the parity checks is utilized as a flipping indicator,
generate a comparison result of comparing the flipping indicator with a flipping threshold, perform a bit flip operation and adjust the reliability values in accordance with at least the comparison result, wherein the bit flip operation flips more than one bit parallelly,
compute a subsequent syndrome of a subsequent output, and
end the decoding of LDPC codes, when a subsequent number of unsatisfied checks obtained based on the computed subsequent syndrome is equal to zero.

9. The apparatus of claim 8, wherein the bit flip operation utilizes a channel reliability vector.

10. The apparatus of claim 8, wherein the bit flip operation utilizes a decoder decision reliability vector.

11. The apparatus of claim 8, wherein the controller is configured to end decoding when the initial number of unsatisfied checks is zero.

12. The apparatus of claim 8, wherein the flipping threshold is computed by the subsequent number of unsatisfied checks.

13. The apparatus of claim 8, wherein the bit flip operation utilizes a confirming threshold.

14. The apparatus of claim 13, wherein the confirming threshold is computed by a flipping threshold and the number of subsequent unsatisfied checks.

* * * * *